(12) United States Patent
Chang

(10) Patent No.: US 6,813,206 B2
(45) Date of Patent: Nov. 2, 2004

(54) SINGLE ENDED SENSE AMPLIFIER

(75) Inventor: Cheng-Hsin Chang, Hsinchu (TW)

(73) Assignee: Realtek Semiconductor Corp. (TW)

( * ) Notice: Subject to any disclaimer, the term of this patent is extended or adjusted under 35 U.S.C. 154(b) by 135 days.

(21) Appl. No.: 10/310,318

(22) Filed: Dec. 5, 2002

(65) Prior Publication Data

US 2003/0107934 A1 Jun. 12, 2003

(30) Foreign Application Priority Data

Dec. 11, 2001 (TW) .......................................... 90130733 A

(51) Int. Cl.⁷ .................................................. G11C 7/00
(52) U.S. Cl. .................................. 365/205; 365/185.21
(58) Field of Search .............................. 365/205, 185.21

(56) References Cited

U.S. PATENT DOCUMENTS

| | | | | |
|---|---|---|---|---|
| 5,056,063 A | * | 10/1991 | Santin et al. | .......... 365/185.21 |
| 5,495,191 A | | 2/1996 | Lev et al. | |
| 6,219,290 B1 | * | 4/2001 | Chang et al. | ............... 365/207 |
| 6,411,550 B1 | * | 6/2002 | Nasu | ..................... 365/185.21 |
| 2002/0105831 A1 | * | 8/2002 | Lee et al. | .............. 365/185.21 |

* cited by examiner

Primary Examiner—Hoai Ho
(74) Attorney, Agent, or Firm—Raymond Sun

(57) ABSTRACT

The present invention is related to a single ended sense amplifier, which is engaged in receiving signals of a memory apparatus of a semiconductor, and generates output signals in an output terminal. The single ended sense amplifier comprises: a first loading unit, which offers a loading current; a first sense switch unit, which is in between a memory apparatus of semiconductor and the first loading unit to couple them together, and connects to the first loading unit to form an output terminal in order to be as a channel switch for a channel from semiconductor memory apparatus to the output terminal of the sense amplifier; a second loading unit, which offers a charging current; a second sense switch unit, which is in between the semiconductor memory apparatus and the second loading unit to couple them together; an inverse logic unit, which is among the semiconductor memory apparatus, the first sense switch unit and the second sense switch unit for controlling the plural sense switch units. Hence, The second sense switch unit is capable to control the charging current to improve the reaction speed of the sense amplifier without pre-charging control signals.

20 Claims, 3 Drawing Sheets

SINGLE ENDED SENSE AMPLIFIER

FIELD OF THE INVENTION

The invention relates to a sense amplifier, especially a single ended sense amplifier without a pre-charged signal.

BACKGROUND OF THE INVENTION

The sense amplifier is engaged in receiving signals of a memory apparatus of a semiconductor, and generates output signals in an output terminal. FIG. 1 is a circuit scheme of a single ended sense amplifier in prior art. As shown in FIG. 1, a single ended sense amplifier 10 comprises a sense switch unit 11, an inverse logic unit 12 and a loading unit 13. The sense switch unit 11 is in between the memory apparatus in the semiconductor and the output terminal of the sense amplifier to couple them together; besides it is usually a N-channel metal-oxide semiconductor (NMOS) to be as a channel switch for controlling a channel from the memory apparatus to the output terminal. The inverse logic unit 12 is between the memory apparatus and the sense switch unit 11 to turn on or off the sense switch unit 11. Generally, the inverse logic unit 12 can be an inverter or a NOR gate or an inverse amplifier. The loading unit 13 couples with the sense switch unit 11 to share electric current of the sense switch unit 11, and it is normally a N-channel metal-oxide semiconductor (NMOS) or a P-channel metal-oxide semiconductor (PMOS). The single ended sense amplifier 10 is restricted by the driving capability of the loading unit 13, therefore it causes reacting speed being put bounds.

For solving the reacting speed problem, to add a pre-charged unit on output terminal of the single ended sense amplifier is the most common usage. FIG. 2 is a circuit scheme of the single ended sense amplifier with pre-charging function. As shown in FIG. 2, a single ended sense amplifier 20 can be pre-charged via a pre-charging control signal through a transistor 24 to enhance the driving capability of the loading unit 13, it is that the reacting speed of the single ended sense amplifier 20 has been improved. As the type of the single ended sense amplifier 20, the pre-charging control signal is needful; besides, the signal ended sense amplifier 20 cannot be applied to any condition, for instance, the pre-charging control signal cannot be supplied.

SUMMARY OF THE INVENTION

According to aforesaid, the present invention is to offer a single ended sense amplifier without a pre-charging signal to improve reacting speed.

To achieve above objective, the single ended sense amplifier of the present invention comprises: a first loading unit, which is for current loading; a first sense switch unit, which is in between a memory apparatus of semiconductor and the first loading unit to couple them together, and connects to the first loading unit to form an output terminal in order to be as a channel switch for a channel from semiconductor memory apparatus to the output terminal of the sense amplifier; a second loading unit, which offers greater current loading than the first loading unit; a second sense switch unit, which is in between the semiconductor memory apparatus and the second loading unit to couple them together so as to supply charging needs; an inverse logic unit, which is among the semiconductor memory apparatus, the first and the second sense switch units for turning on and off the first and the second sense switch units.

As it can be seen, the second sense switch unit is capable to provide charging current to improve the reaction speed of the sense amplifier without a pre-charging control signal. Other and further features, advantages and benefits of the invention will become apparent in the following description taken in conjunction with the following drawings. It is to be understood that the foregoing general description and following detailed description are exemplary and explanatory but are not to be restrictive of the invention. For instance, two independent inverse logic units control two sense switch units other than one inverse logic unit of the embodiment of the present invention. The accompanying drawings are incorporated in and constitute a part of this application and, together with the description, serve to explain the principles of the invention in general terms. Like numerals refer to like parts throughout the disclosure

DETAILED DESCRIPTION OF THE PREFERRED EMBODIMENTS

Following drawings are detail descriptions to a single ended sense amplifier of the present invention.

Figure 2:
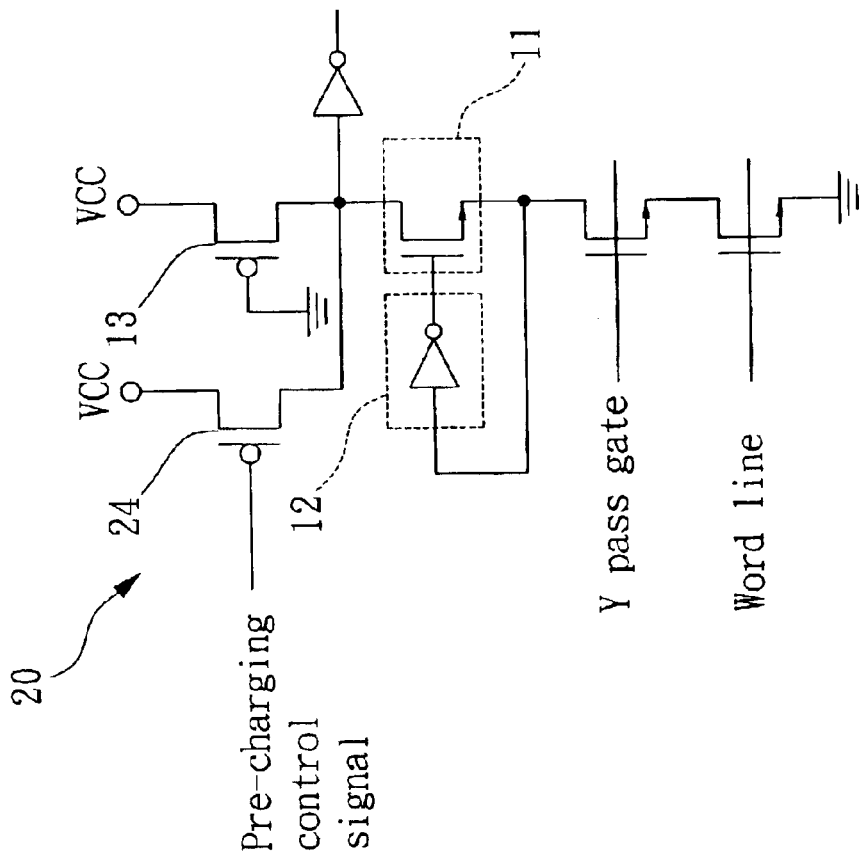
FIG. 2 is a circuit scheme of the single ended sense amplifier with pre-charging function.
Figure 3:
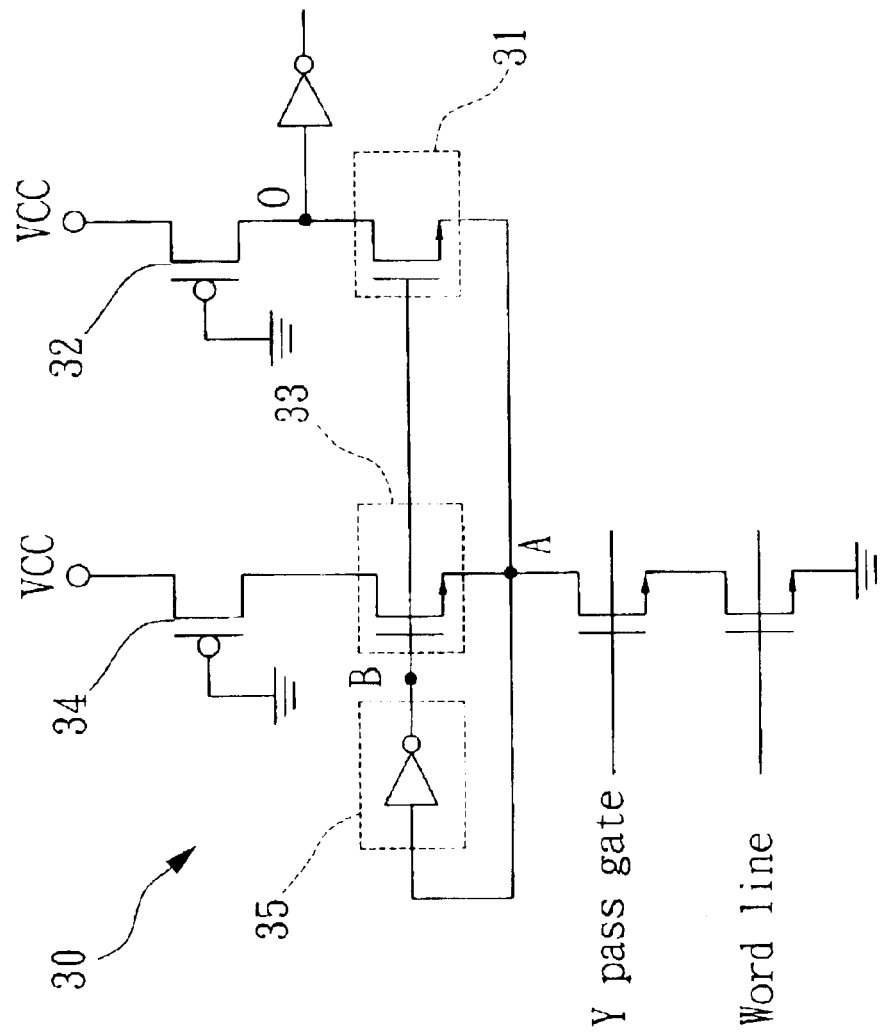
FIG. 3 is a circuit scheme of a single ended sense amplifier of the present invention.

FIG. 3 is a circuit scheme of the single ended sense amplifier of the present invention. A single ended sense amplifier 30 comprises a first sense switch unit 31, a first loading unit 32, a second sense switch unit 33, a second loading unit 34 and an inverse logic unit 35. Comparing to the single ended sense amplifier in prior art, shown in FIG. 1, the embodiment has one more set of the sense switch unit and the loading unit in order to provide charging current from the second loading unit 34 through the second sense switch unit 33 for advancing reaction speed of the sense amplifier 30 when a point A is in low voltage. Comparing to the single ended sense amplifier with charging function, shown in FIG. 2, the embodiment has one more sense switch unit in order to control charging time and omit the pre-charging control signal.

Figure 1:
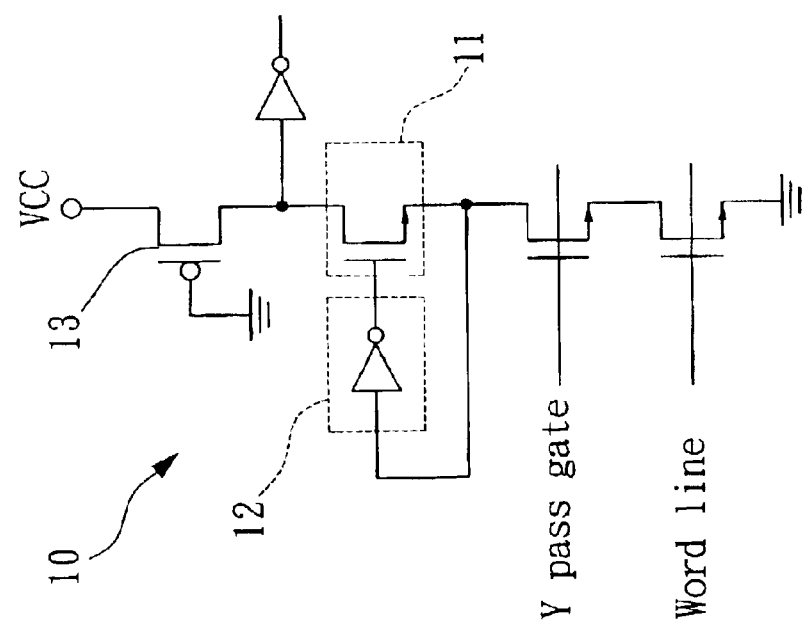
FIG. 1 is a circuit scheme of a single ended sense amplifier in prior art.

The first sense switch unit 31, the first loading unit 32 and the inverse logic unit 35 have the same function as the sense amplifier shown in FIG. 1, and it will no longer be discussed further hereinafter. A structure of the second loading unit 34 is same as a structure of the first loading unit 32, and a difference between them is that greater current loading is given by the second loading unit 34. A structure of the second sense switch unit 33 is same as the first sense switch unit 31 as well, and a difference between them is that greater equivalent impedance is brought by the second sense switch unit 33. As shown in the FIG. 4, current supplied by the first sense switch unit 31 and the first loading unit 32 highly increase voltage at point O when charging is almost completed; meanwhile the second sense switch unit 33 almost approaches a status of fully charging. According to the mention above, the second loading unit 34 has same function with the transistor 24 in FIG. 2, further, the second sense switch unit 33 is able to automatically turn off to be instead of pre-charging control signals.

Figure 4:
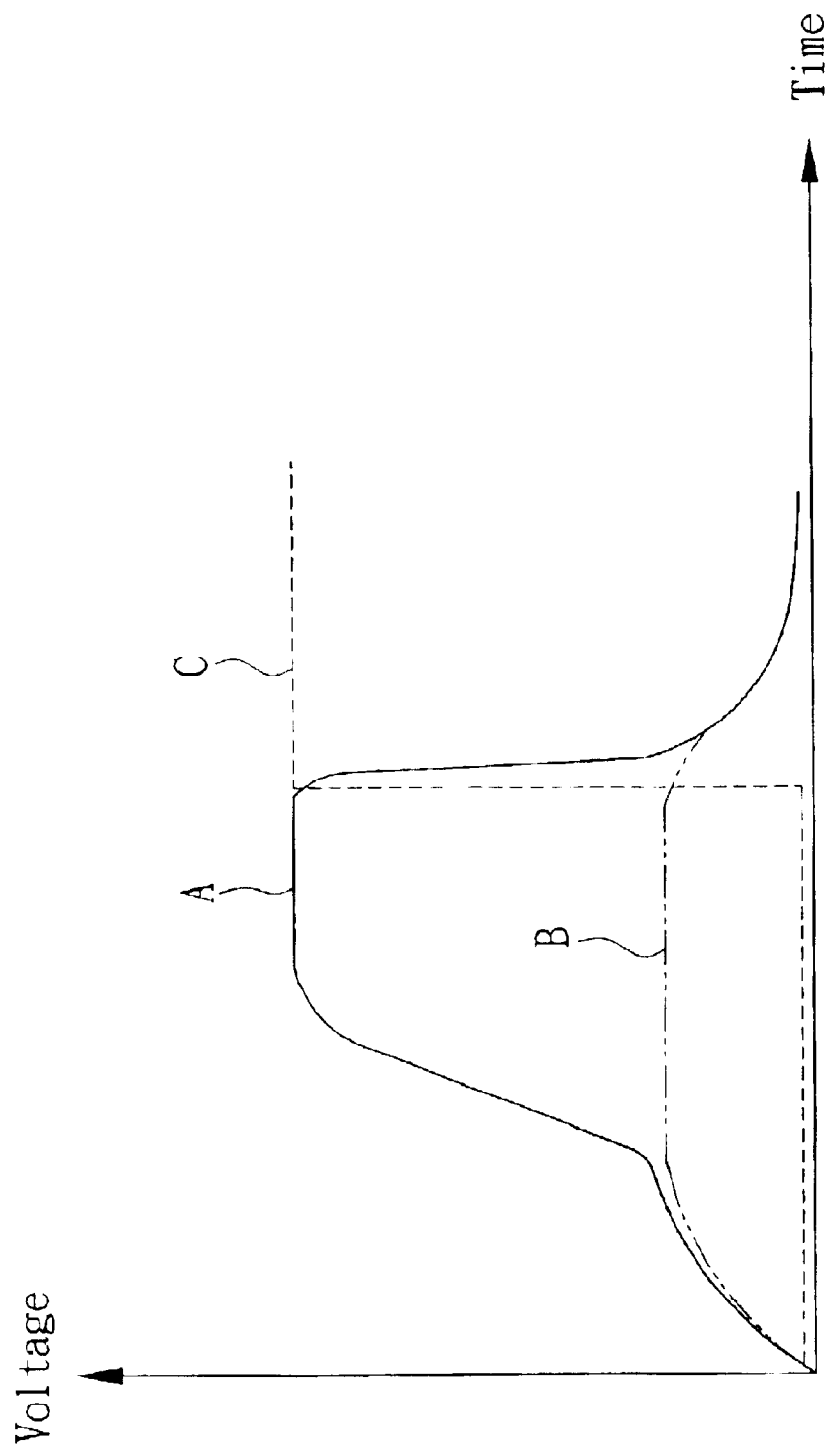
FIG. 4 is a voltage variation curve scheme when output of a memory element of a memory apparatus is ON or OFF.

Please refer to FIG. 4, which is a voltage variation curve scheme when output of a memory element of a memory apparatus is ON or OFF. The figure explains actions of the first sense switch unit and the second sense switch. Curves A and B are assemblies of voltage values of points O and A; a curve C is assembled by plural voltage values of a word line. Thus assuming an initial voltage of point A is 0 V, another initial voltage of the word line is also 0 V, the inverse logic unit 35 will generate a logic 1 voltage on a point B after point A being input the inverse logic unit 35. Meanwhile the first sense switch unit 31 and the second sense switch unit 33 are both conducted to employ in charging. The second loading unit 34 has larger loading, a charging speed of point A is faster than another charging speed of using the single first sense switch unit 31; besides to increase the voltage on point A will be in a shorter time period. When point A approaching to a saturated voltage, point O is highly increased. It is a situation that the memory unit is OFF. Continuously, curve C (word line) goes up to VCC, which means the ON. The equivalent impedance of the transistor of the first sense switch unit 31 is smaller than the equivalent impedance of the transistor of the second sense switch unit 33, therefore current through the first loading unit 32 is much greater than current through the second loading unit 34, continuously curve A goes down immediately when it meets VCC. The sense amplifier of the present invention adopts the second loading unit and the second sense switch unit to provide charging current, and the second sense switch unit is automatically turned off. Hence, according to the above discussion, the sense amplifier functions pre-charging, but without pre-charging control signals; besides, the reaction speed is faster as well. Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A sense amplifier receiving a signal of a memory apparatus of a semiconductor, comprising:
    a first loading unit provided loading current;
    a first switch unit coupled between the memory apparatus and the first loading unit, and connecting to the first loading unit to form an output terminal of the sense amplifier;
    a second loading unit provided charging current;
    a second switch unit coupled between the memory apparatus and the second loading unit; and
    an inverse unit coupled between the memory apparatus and a control terminal of the first and second switch units, and controlling the first and second switch units,
    wherein the second switch unit controls the charging current to improve the reaction speed of the sense amplifier.

2. The sense amplifier as cited in claim 1, wherein the charging current is bigger than the loading current.

3. The sense amplifier as cited in claim 1, wherein, an equivalent impedance of said second switch unit is bigger than that of said first switch unit.

4. The sense amplifier as cited in claim 1, wherein, the first and second switch units are a N-channel metal-oxide semiconductor.

5. The single ended amplifier as cited in claim 1, wherein, the inverse unit is a NOR gate or an inverter or an inverse amplifier.

6. The sense amplifier as cited in claim 4, wherein, the inverse unit is an inverter, and an output terminal of the inverter connects to a NMOS gate of the first and second switch units simultaneously.

7. The sense amplifier as cited in claim 1, wherein, the first loading unit is a P-channel metal-oxide semiconductor (PMOS).

8. The sense amplifier as cited in claim 1, wherein, the second loading unit is a P-channel metal-oxide semiconductor (PMOS).

9. A sense amplifier receiving signals of a memory apparatus of a semiconductor, comprising:
    a first loading unit provided loading current;
    a first switch unit coupled between the memory apparatus and said first loading unit;
    a second loading unit provided charging current;
    a second switch unit coupled between said memory apparatus and said second loading unit; and
    an inverse logic unit coupled between said memory apparatus and a control terminal of said first and second switch units, and controlling said first and second switch units,
    wherein said second switch unit controls said charging current to improve the reaction speed of said sense amplifier.

10. The sense amplifier as cited in claim 9, wherein, an equivalent impedance of said second switch unit is bigger than that of said first switch unit.

11. The sense amplifier as cited in claim 9, wherein, said first and second switch units are a N-channel metal-oxide semiconductor.

12. The sense amplifier as cited in claim 11, wherein, said inverse logic unit is an inverter, and an output terminal of said inverter connects to a NMOS gate of said first and second switch units simultaneously.

13. The sense amplifier as cited in claim 9, wherein, said first and said second loading units are P-channel metal-oxide semiconductor (PMOS).

14. The sense amplifier as cited in claim 9, wherein, said inverse unit is an inverter or an inverse amplifier or a NOR gate.

15. The sense amplifier as cited in claim 9, wherein said charging current is bigger than said loading current.

16. In a semiconductor, a sense amplifier receiving signals of a memory apparatus of said semiconductor, said sense amplifier without a pre-charged signal, a method comprising:
    providing loading current from a first loading unit, wherein a first switch unit controls said loading current;
    providing charging current from a second loading unit, wherein a second switch unit controls said charging current; and
    simultaneously controlling said first and said second switch units, wherein said second switch unit controls said charging current to improve the reaction speed of said sense amplifier.

17. The method as cited in claim 16, wherein said charging current is bigger than said loading current.

18. The method as cited in claim 16, wherein, an equivalent impedance of said second switch unit is bigger than that of said first switch unit.

19. The method as cited in claim 16, wherein, said first and said second loading units are P-channel metal-oxide semiconductor (PMOS).

20. The method as cited in claim 16, wherein, said first and second switch units are a N-channel metal-oxide semiconductor.

* * * * *